United States Patent
Iwamoto

(10) Patent No.: US 10,075,148 B2
(45) Date of Patent: Sep. 11, 2018

(54) RESONANCE CIRCUIT COMPLEX ELECTRONIC COMPONENT AND RESONANCE CIRCUIT DEVICE

(71) Applicant: Murata Manufacturing Co., Ltd., Nagaokakyo-shi, Kyoto-fu (JP)

(72) Inventor: Takashi Iwamoto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 30 days.

(21) Appl. No.: 15/369,939

(22) Filed: Dec. 6, 2016

(65) Prior Publication Data
US 2017/0126201 A1    May 4, 2017

Related U.S. Application Data

(63) Continuation of application No. PCT/JP2015/067409, filed on Jun. 17, 2015.

(30) Foreign Application Priority Data

Jun. 18, 2014   (JP) .................. 2014-124910

(51) Int. Cl.
*H03H 9/54* (2006.01)
*H01L 25/00* (2006.01)
(Continued)

(52) U.S. Cl.
CPC ............. *H03H 9/542* (2013.01); *H01L 25/00* (2013.01); *H03H 1/0007* (2013.01); *H03H 7/01* (2013.01); *H03H 9/059* (2013.01); *H03H 9/0542* (2013.01); *H03H 9/0552* (2013.01); *H03H 9/17* (2013.01); *H03H 9/205* (2013.01); *H03H 9/25* (2013.01); *H03H 9/566* (2013.01); *H03H 9/64* (2013.01); *H01L 2224/04105* (2013.01);
(Continued)

(58) Field of Classification Search
CPC ...... H03H 9/542; H03H 1/0007; H03H 9/205; H03H 2001/0021; H03H 2210/025; H03H 9/25; H03H 9/64; H03H 7/38; H03H 9/42
USPC ........................................... 333/186
See application file for complete search history.

(56) References Cited

U.S. PATENT DOCUMENTS

2014/0354512 A1   12/2014   Kadota
2015/0180447 A1    6/2015   Okuda

FOREIGN PATENT DOCUMENTS

JP   2002-232259 A   8/2002
JP   2006-333168 A   12/2006
(Continued)

OTHER PUBLICATIONS

Official Communication issued in corresponding International Application PCT/JP2015/067409, dated Jul. 21, 2015.

*Primary Examiner* — Benny Lee
*Assistant Examiner* — Hafizur Rahman
(74) *Attorney, Agent, or Firm* — Keating & Bennett, LLP

(57) ABSTRACT

A resonance circuit complex electronic component includes a first circuit element and a second circuit element defining a resonance circuit, an external connection terminal connected to outside, and a plurality of routing conductors connecting an external terminal of the first circuit element and an external terminal of the second circuit element to the external connection terminal, respectively. At least one of the plurality of routing conductors includes an inductor conductor extending in a direction not in parallel with a mounting surface.

16 Claims, 7 Drawing Sheets

(51) Int. Cl.
  *H03H 7/01* (2006.01)
  *H03H 9/17* (2006.01)
  *H03H 9/25* (2006.01)
  *H03H 1/00* (2006.01)
  *H03H 9/205* (2006.01)
  *H03H 9/05* (2006.01)
  *H03H 9/56* (2006.01)
  *H03H 9/64* (2006.01)

(52) U.S. Cl.
  CPC ............... *H01L 2224/12105* (2013.01); *H01L 2224/19* (2013.01); *H01L 2224/32145* (2013.01); *H01L 2924/0002* (2013.01); *H03H 2001/0021* (2013.01); *H03H 2210/025* (2013.01); *H05K 999/99* (2013.01)

(56) References Cited

FOREIGN PATENT DOCUMENTS

| | | | |
|---|---|---|---|
| JP | 2011-211347 A | | 10/2011 |
| KR | 20020072055 A | * | 9/2002 |
| WO | 2013/125360 A1 | | 8/2013 |
| WO | 2014/045726 A1 | | 3/2014 |

* cited by examiner

RESONANCE CIRCUIT COMPLEX ELECTRONIC COMPONENT AND RESONANCE CIRCUIT DEVICE

CROSS REFERENCE TO RELATED APPLICATIONS

This application claims the benefit of priority to Japanese Patent Application 2014-124910 filed on Jun. 18, 2014 and is a Continuation Application of PCT/JP2015/067409 filed on Jun. 17, 2015. The entire contents of each application are hereby incorporated herein by reference.

BACKGROUND OF THE INVENTION

1. Field of the Invention

The present invention relates to a resonance circuit complex electronic component preferably for use in a resonance circuit, and a resonance circuit device.

2. Description of the Related Art

Various types of resonance circuit devices have been conventionally known in which various electronic components are disposed in a dielectric board so as to define a resonance circuit. For example, as one type of the resonance circuit devices, Japanese Unexamined Patent Application Publication No. 2002-232259 describes a surface acoustic wave device including a surface acoustic wave element, an inductor, a variable capacitor (variable capacitance element), and a dielectric board.

In the surface acoustic wave device described in Japanese Unexamined Patent Application Publication No. 2002-232259, the surface acoustic wave element including a piezoelectric layer in which comb-shaped electrodes and reflectors are provided, and the inductor and the variable capacitor formed by micro machine processing are disposed in or on the surface of the dielectric board. The surface acoustic wave element, the inductor, and the variable capacitor are spaced away from one another in a plan view of the surface of the dielectric board.

However, in the structure described in Japanese Unexamined Patent Application Publication No. 2002-232259, the size of the inductor increases with an increase in the Q value of the inductor. This causes an increase in the size of the surface acoustic wave device, that is, the resonance circuit device.

SUMMARY OF THE INVENTION

Preferred embodiments of the present invention provide a resonance circuit complex electronic component that prevents characteristic deterioration while achieving a compact resonance circuit device, and a resonance circuit device including the resonance circuit complex electronic component.

A resonance circuit complex electronic component according to a preferred embodiment of the present invention includes a first circuit element and a second circuit element defining a resonance circuit, and an external connection terminal connected to the outside. The resonance circuit complex electronic component includes a plurality of routing conductors that connect an external terminal of the first circuit element and an external terminal of the second circuit element to the external connection terminal, respectively. At least one of the plurality of routing conductors includes an inductor conductor that extends in a direction not in parallel with a mounting surface.

In this structure, the routing conductor of the circuit element defines at least a portion of an inductor of a resonance circuit. Therefore, using the resonance circuit complex electronic component according to a preferred embodiment of the present invention achieves an increase in the Q value of the inductor of the resonance circuit.

A resonance circuit complex electronic component according to a preferred embodiment of the present invention preferably has the following structure. The resonance circuit complex electronic component includes a multilayer member that includes the first circuit element and the second circuit element embedded therein in a laminated state such that a mounting surface of the first circuit element and a mounting surface of the second circuit element are in parallel or approximately in parallel with each other, and an external connection terminal provided in an outer surface on the side of the second circuit element in a lamination direction. At least one of the plurality of routing conductors includes an inductor conductor that is longer than at least the thickness of the second circuit element.

This structure enables a further increase in the Q value.

In a resonance circuit complex electronic component according to a preferred embodiment of the present invention, the inductor conductor preferably has a structure that extends in a thickness direction of the second circuit element a plurality of times.

This structure facilitates providing a long inductor conductor, thus further increasing the Q value.

In a resonance circuit complex electronic component according to a preferred embodiment of the present invention, the inductor conductor is preferably structured in a shape extending in the lamination direction.

This structure facilitates easy formation of the inductor conductor.

A resonance circuit complex electronic component according to a preferred embodiment of the present invention preferably has the following structure. The first circuit element has a larger area in a plan view than an area of the second circuit element. When the multilayer member is viewed from the surface on which the external connection terminal is provided the first circuit element and the second circuit element overlap each other, and the inductor conductor is provided in an area in which the first circuit element and the second circuit element do not overlap.

This structure makes the resonance circuit complex electronic component more compact.

A resonance circuit device according to a preferred embodiment of the present invention includes a resonance circuit complex electronic component as described above, a surface mount inductor element, and a board in which the resonance circuit complex electronic component and the surface mount inductor element are mounted. The surface mount inductor element and the inductor conductor are connected to each other.

In this structure, an inductor of a resonance circuit includes the surface mount inductor element and the inductor conductor. Therefore, it is possible to increase the Q value of the inductor of the resonance circuit, without increasing the size of the surface mount inductor element.

In a resonance circuit device according to a preferred embodiment of the present invention, the inductor conductor has a function of shifting the resonant frequency of the resonance circuit complex electronic component.

In a resonance circuit device according to a preferred embodiment of the present invention, the resonance circuit is preferably a variable filter.

In a resonance circuit device according to a preferred embodiment of the present invention, at least one of the first circuit element and the second circuit element is preferably a resonator.

In a resonance circuit device according to a preferred embodiment of the present invention, at least one of the first circuit element and the second circuit element is preferably a variable capacitance element.

According to various preferred embodiments of the present invention, a compact resonance circuit device having superior characteristics is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
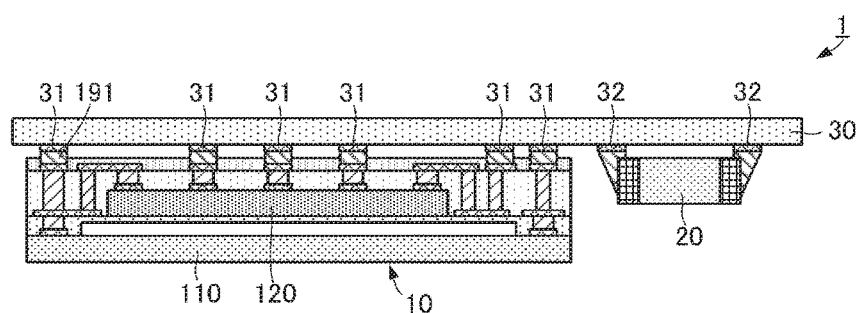
FIG. 1 is a side view of a resonance circuit complex electronic component and a resonance circuit device according to a first preferred embodiment of the present invention.
Figure 2:
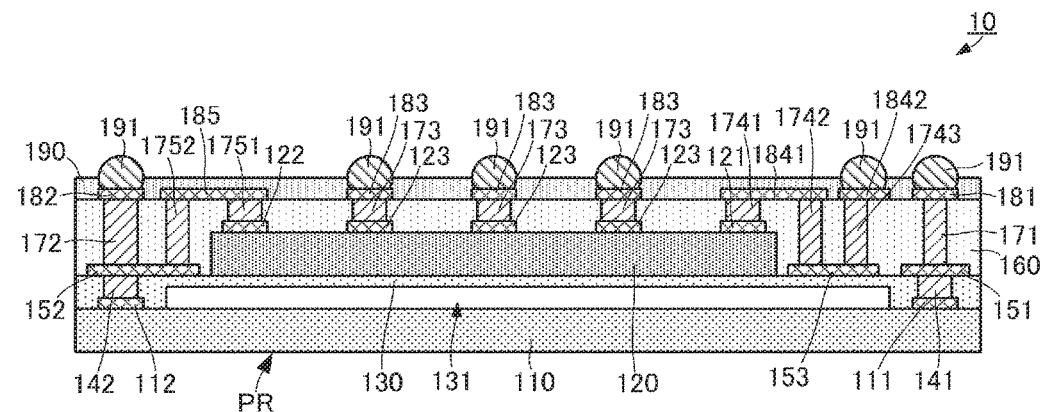
FIG. 2 is a side view of the resonance circuit complex electronic component according to the first preferred embodiment of the present invention.

A resonance circuit complex electronic component and a resonance circuit device according to a first preferred embodiment of the present invention will be described with reference to the drawings. FIG. 1 is a side view showing the resonance circuit complex electronic component and the resonance circuit device according to the first preferred embodiment of the present invention. FIG. 2 is a side view of the resonance circuit complex electronic component according to the first preferred embodiment of the present invention. FIGS. 1 and 2 show a side section of the resonance circuit complex electronic component.

As shown in FIG. 1, a resonance circuit device 1 includes a resonance circuit complex electronic component 10, a surface mount inductor element 20, and a board 30. The board 30 is a mounting board including mounting lands 31 and 32 provided therein. The mounting land 31 is a land conductor on which the resonance circuit complex electronic component 10 is mounted. The resonance circuit complex electronic component 10 is bonded to the mounting land 31 with solder balls 191, that is, external connection terminals of the resonance circuit complex electronic component 10. The mounting land 32 is a land conductor on which the surface mount inductor element 20 is mounted. The surface mount inductor element 20 is bonded to the mounting land 32 at its external connection terminals preferably by soldering or other conductive connection. The resonance circuit complex electronic component 10 and the surface mount inductor element are connected through a conductive pattern provided in the board 30 to connect the mounting lands 31 and 32.

As shown in FIG. 2, the resonance circuit complex electronic component 10 includes a multilayer member into which a piezoelectric resonance element PR and a variable capacitor 120 are laminated. Preferably, each of the piezoelectric resonance element PR and the variable capacitor 120 has a plane shape or a substantially plane shape and includes mounting terminals on one of plate surfaces. The variable capacitor 120 is laminated on a mounting surface (surface provided with the mounting terminals) of the piezoelectric resonance element PR in contact therewith. The variable capacitor 120 is laminated on the piezoelectric resonance element PR such that a mounting surface (surface provided with the mounting terminals) of the variable capacitor 120 faces in a direction opposite to the piezoelectric resonance element PR.

The surface (mounting surface) of the variable capacitor 120 is preferably smaller than the surface (mounting surface) of the piezoelectric resonance element PR in size. Thus, as shown in FIG. 2, the mounting surface of the piezoelectric resonance element PR includes an area that the variable capacitor 120 does not contact so as to enclose an area on which the variable capacitor 120 is laminated.

The piezoelectric resonance element PR includes a plate-shaped or substantially plate-shaped piezoelectric resonator 110. The piezoelectric resonator 110 is a surface acoustic wave resonator in which IDT electrodes (not shown) are provided in or on the surface of a piezoelectric substrate, for example, a LT (lithium tantalite) substrate. In or on the surface of the piezoelectric substrate, terminal conductors (electrodes) 111 and 112 of the resonator, which are connected to the IDT electrodes, are provided. A cover layer 130 preferably made of an insulating material is provided on the surface of the piezoelectric resonator 110.

The cover layer 130 does not contact the surface of the piezoelectric resonator 110 in an area in which the IDT electrodes are provided. That is, in the area of the IDT electrodes of the piezoelectric resonator 110, a gap 131 is provided between the cover layer 130 and the piezoelectric substrate. Via conductors 141 and 142 are provided in the cover layer 130 in areas contacting the terminal conductors 111 and 112 of the resonator, respectively. The via conductors 141 and 142 penetrate the cover layer 130.

In or on the surface of the cover layer 130, terminal conductors 151 and 152 and a routing conductor 153 of the piezoelectric element are provided. Thus, the surface of the cover layer 130 corresponds to the mounting surface of the piezoelectric resonance element PR. The terminal conductor 151 of the piezoelectric element overlaps the terminal conductor 111 of the resonator and the via conductor 141, in a plan view of the piezoelectric resonator 110. The terminal conductor 152 of the piezoelectric element overlaps the terminal conductor 112 of the resonator and the via conductor 142, in a plan view of the piezoelectric resonator 110. The terminal conductor 152 of the piezoelectric element also defines and functions as a routing conductor. The terminal conductors 151 and 152 and the routing conductor 153 of the piezoelectric element are provided in the piezoelectric resonance element PR in an area not contacting the variable capacitor 120. The routing conductor 153 extends in a direction that connects between one side surface of the variable capacitor 120 and a side surface of the resonance circuit complex electronic component 10 parallel or substantially parallel thereto.

A via conductor 171 is provided on the surface of the terminal conductor 151 of the piezoelectric element. Via conductors 172 and 1752 are provided on the surface of the terminal conductor 152 of the piezoelectric element. The via conductor 172 is provided in the terminal conductor 152 and overlaps the via conductor 142, in a plan view of the resonance circuit complex electronic component 10 (when viewed from a direction orthogonal or substantially orthogonal to the mounting surface). The via conductor 1752 is provided in the terminal conductor 152 in an area having the function of the routing conductor, and located a predetermined distance away from the via conductor 172 and in a vicinity of the variable capacitor 120.

Via conductors 1742 and 1743 are provided on the surface of the routing conductor 153. The via conductor 1742 is provided at one end in an extending direction of the routing conductor 153, while the via conductor 1743 is provided at the other end in the extending direction of the routing conductor 153. In other words, the via conductors 1742 and 1743 are disposed in a direction that connects between the one side surface of the variable capacitor 120 and the side surface of the resonance circuit complex electronic component 10 parallel or substantially parallel thereto while leaving a gap therebetween.

In the mounting surface of the variable capacitor 120, terminal conductors 121, 122, and 123 of the variable capacitor are provided. The terminal conductors 121, 122, and 123 correspond to "external terminals". A via conductor 1741 is provided on the surface of the terminal conductor 121 of the variable capacitor. A via conductor 1751 is provided on the surface of the terminal conductor 122 of the variable capacitor. A via conductor 173 is provided on the surface of each of the plurality of terminal conductors 123 of the variable capacitor.

An insulating resin 160 is provided on the mounting surface of the piezoelectric resonance element PR in which the variable capacitor 120 and the via conductors 171, 172, 173, 1741, 1742, 1743, 1751, and 1752 are provided. The insulating resin 160 covers the variable capacitor 120. Distal ends of the via conductors 171, 172, 173, 1741, 1742, 1743, 1751, and 1752 are exposed from a surface of the insulating resin 160, that is, an opposite surface of the insulating resin 160 from a surface contacting the piezoelectric resonance element PR.

In or on the surface of the insulating resin 160, external connection terminal conductors 181, 182, 183, and 1842 and routing conductors 1841 and 185 are provided. The external connection terminal conductor 181 overlaps the via conductor 171, in a plan view of the piezoelectric resonator 110. The external connection terminal conductor 182 overlaps the via conductor 172, in a plan view of the piezoelectric resonator 110. Each of the plurality of external connection terminal conductors 183 overlaps each of the plurality of via conductors 173, in a plan view of the piezoelectric resonator 110. The external connection terminal conductor 1842 overlaps the via conductor 1743, in a plan view of the piezoelectric resonator 110. The routing conductor 1841 overlaps both of the via conductors 1741 and 1742 and connects between the via conductors 1741 and 1742. The routing conductor 185 overlaps both of the via conductors 1751 and 1752 and connects between the via conductors 1751 and 1752.

The solder balls 191 are provided on the external connection terminal conductors 181, 182, 183, and 1842 in or on the surface of the insulating resin 160. A protective layer 190 is also provided in or on the surface of the insulating resin 160 in an area except the locations of the solder balls 191.

In this structure, a conductor path that connects between the terminal conductor 121 of the variable capacitor 120 and the external connection terminal conductor 1842 includes the via conductor 1741, the routing conductor 1841, the via conductor 1742, the routing conductor 153, and the via conductor 1743. That is, the terminal conductor 121 of the variable capacitor 120 and the external connection terminal conductor 1842 are connected, for example, through a meandering conductive pattern. Thus, the meandering conductive pattern, which is a routing conductor path, is able to be used as an inductor. Therefore, when the structure shown in FIG. 1 is provided and the inductor element 20 is connected to the external connection terminal conductor 1842 through a conductive pattern of the board 30, the inductor element 20 and the meandering conductive pattern define an inductor.

As described above, according to the present preferred embodiment, the meandering conductive pattern is structured, not in two dimensions, but in three dimensions. This provides an improvement in the Q value of the inductor. Also, the inductance of the resonance circuit device 1 is able to be increased without increasing the size of the inductor element 20. Therefore, a compact resonance circuit device 1 is provided that includes the inductor with a favorable Q value.

In the structure of the present preferred embodiment, the meandering conductive pattern is provided, in the resonance circuit complex electronic component 10, on a multilayer body including the piezoelectric resonance element PR and the variable capacitor 120 in an area in which the variable capacitor 120 is not overlaid on the piezoelectric resonance element PR. Thus, it is not necessary to provide another long conductive pattern having a long conductor length, such as the meandering conductive pattern, by providing new space in the resonance circuit complex electronic component 10. Therefore, the resonance circuit complex electronic component 10 is compact, and thus, the resonance circuit device 1 is also compact.

Also, in the present preferred embodiment, as shown in FIG. 2, the via conductor 1751, the routing conductor 185, the via conductor 1752, the terminal conductor 152, and the via conductor 172 define another meandering conductive pattern. In this structure, the terminal conductor 152 and the via conductor 172 also define and function as a conductive pattern for external connection of the piezoelectric resonance element PR. Thus, when the inductor element is connected to the external connection terminal conductor 182 through the conductive pattern of the board 30, the conductive pattern connecting between the inductor element and the piezoelectric resonance element PR also defines and functions as a portion of the meandering conductive pattern that loads an inductor on the inductor element. This improves the compactness of the resonance circuit device 1.

The above-described resonance circuit complex electronic component 10 is preferably manufactured by, for example, the following non-limiting manufacturing method. FIGS. 3A-3E and 4A-4C show the resonance circuit complex electronic component in each step of a manufacturing process according to the first preferred embodiment of the present invention.

Figure 3A:
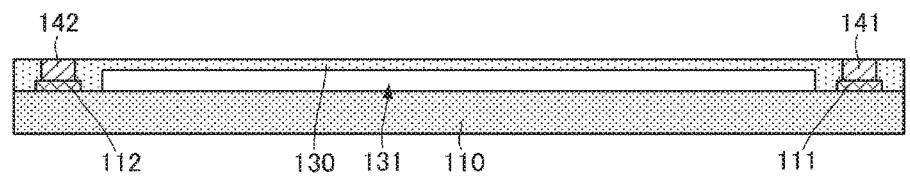
FIGS. 3A-3E are drawings of the resonance circuit complex electronic component in each step of a manufacturing process according to the first preferred embodiment of the present invention.

First, as shown in FIG. 3A, the cover layer 130 including the gap 131 is formed on the surface of the piezoelectric resonator 110 in which the IDT electrodes and the terminal conductors (electrodes) 111 and 112 of the resonator are formed by patterning or other suitable method, for example. Vias are formed in the cover layer 130 in the areas contacting the terminal conductors 111 and 112, in a plan view, and filled with a conductor to form the via conductors 141 and 142.

Figure 3B:
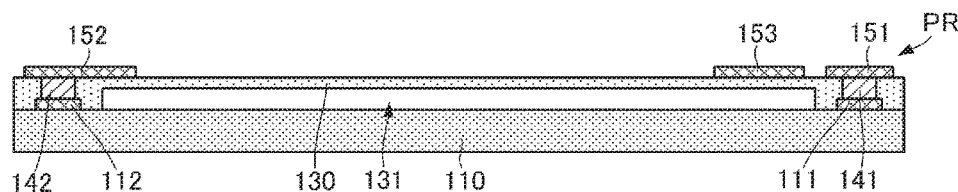

Next, as shown in FIG. 3B, the terminal conductors 151 and 152 and the routing conductor 153 are formed on the surface of the cover layer 130 by resist patterning, vapor deposition, or other suitable method, for example.

Figure 3C:
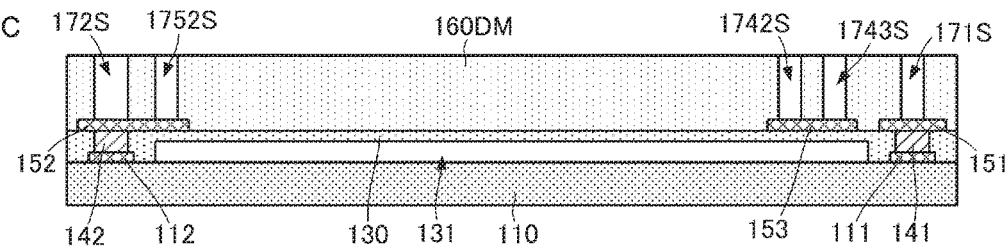

Next, as shown in FIG. 3C, a thick resist 160DM is applied to the surface of the cover layer 130. Then, the resist 160DM is patterned into vias 171S, 172S, 1742S, 1743S, and 1752S by exposure and development.

Figure 3D:
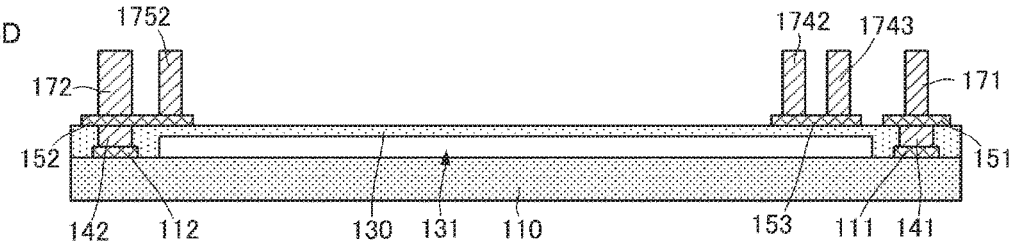

Next, a conductive material having high conductivity, such as copper (Cu), for example, is charged into the vias 171S, 172S, 1742S, 1743S, and 1752S by electrolytic plating or other suitable method, for example. Then, the resist 160DM is removed, as shown in FIG. 3D, to form the via conductors 171, 172, 1742, 1743, and 1752, which are erected in the thickness direction of the resonance circuit complex electronic component 10. The conductive material is not limited to copper (Cu), and may be nickel (Ni), aluminum (Al), silver (Ag), or other suitable conductive material, for example. The forming method is not limited to electrolytic plating, and may be appropriately determined according to the conductive material and its thickness.

Figure 3E:
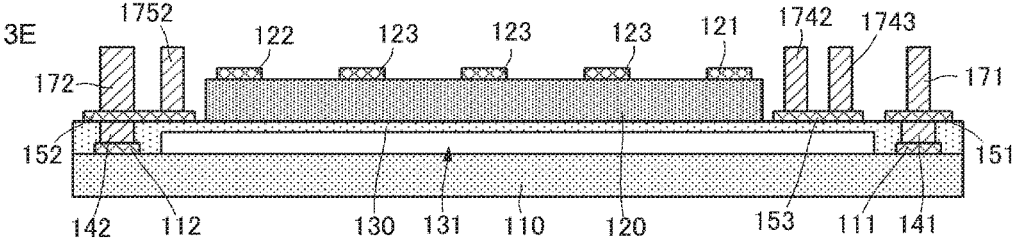

Next, as shown in FIG. 3E, the variable capacitor 120 is disposed on the surface of the cover layer 130. At this time, the variable capacitor 120 is disposed such that the mounting surface of the variable capacitor including the terminal conductors 121, 122, and 123 faces opposite to the cover layer 130. The variable capacitor 120 is disposed in the middle or approximately the middle of the cover layer 130, in a plan view, in an area in which neither the terminal conductors 151 and 152 nor the routing conductor 153 is formed.

Figure 4A:
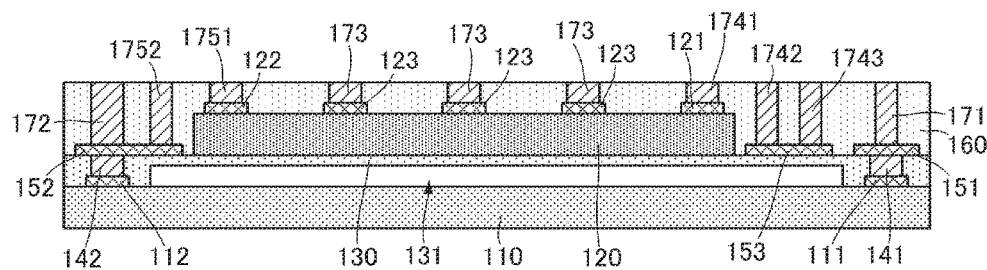
FIGS. 4A-4C are drawings of the resonance circuit complex electronic component in each step of the manufacturing process according to the first preferred embodiment of the present invention.

Next, as shown in FIG. 4A, the insulating resin 160 is formed over the entire or substantially the entire mounting surface of the piezoelectric resonance element PR with a height so as to cover the variable capacitor 120. The insulating resin 160 is preferably made of a material having a low permittivity, and more preferably a material having a permittivity of about 3 or less, for example. Thus, the inductor defined by the above-described meandering conductive pattern has a further improved Q value. Then, as shown in FIG. 4A, the via conductors 173, 1741, and 1751 are formed.

Figure 4B:
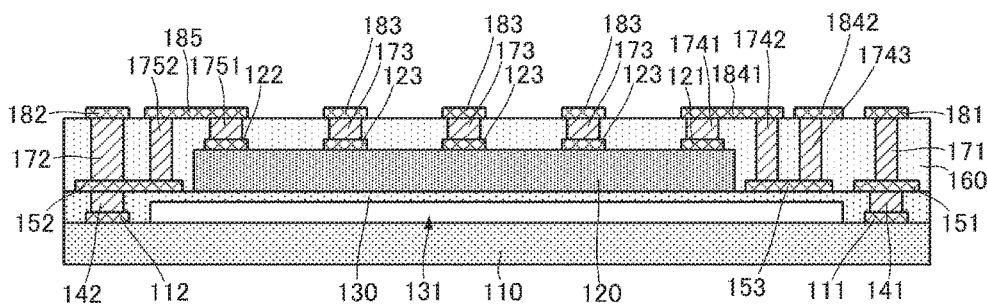

Next, as shown in FIG. 4B, the external connection terminal conductors 181, 182, 183, and 1842 and the routing conductors 1841 and 185 are formed on the surface of the insulating resin 160 by a patterning process, a vapor deposition process, or other suitable process, for example.

Figure 4C:
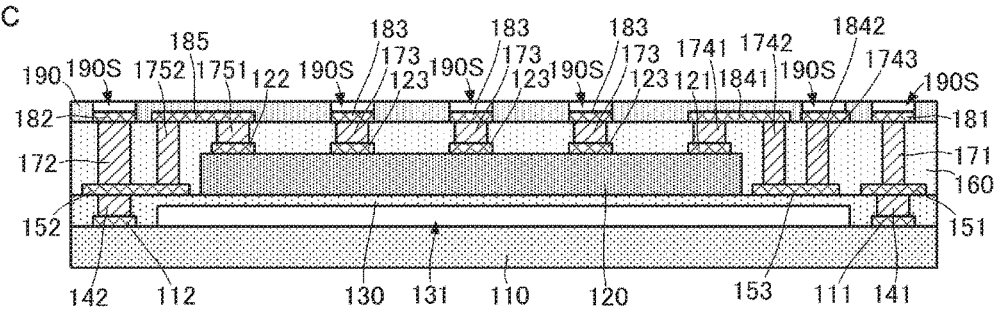

Next, as shown in FIG. 4C, the protective layer 190 is formed on the surface of the insulating resin 160, and vias 191S for the solder balls 191 are formed. A photosensitive epoxy material, for example, is suitably used as the protective layer 190, and the material is applied, exposed, and developed to form the protective layer 190 having the vias 191S formed therein. Then, the solder balls 191 are formed in the vias 191S, and the resonance circuit complex electronic component 10 shown in FIG. 2 is formed.

The manufacturing process is performed in a unit of a base member of a size in which a plurality of the resonance circuit complex electronic components 10 are formable, and the base member is subsequently diced to form the plurality of resonance circuit complex electronic components 10 at the same time.

Figure 5:
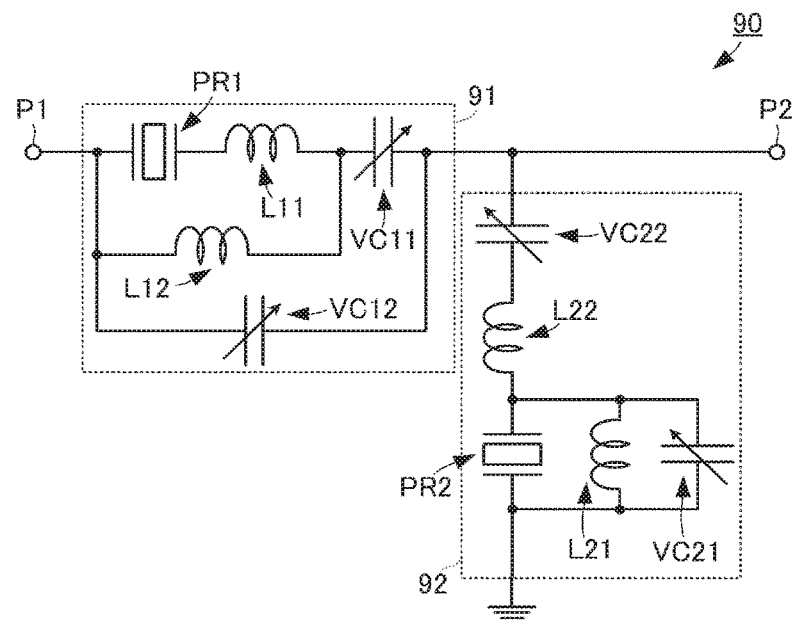
FIG. 5 is an equivalent circuit diagram of a filter circuit that includes the resonance circuit devices according to the first preferred embodiment of the present invention.

The resonance circuit device 1 having this structure is used in a filter circuit and other suitable circuits described below. FIG. 5 is an equivalent circuit diagram of the filter circuit that includes resonance circuit devices according to the first preferred embodiment of the present invention.

A filter circuit 90 includes variable resonance circuits 91 and 92. The variable resonance circuit 91 is connected between a first input and output terminal P1 and a second input and output terminal P2. The variable resonance circuit 92 is connected between an end portion of the variable resonance circuit 91 on the side of the second input and output terminal P2 and a ground.

The variable resonance circuit 91 includes a piezoelectric resonance element PR1, inductors L11 and L12, and variable capacitors VC11 and VC12. The piezoelectric resonance element PR1, the inductor L11, and the variable capacitor VC11 are connected in series. This series circuit is connected to the first input and output terminal P1 at an end portion on the side of the piezoelectric resonance element PR1, and connected to the second input and output terminal P2 at the other end portion on the side of the variable capacitor VC11. The inductor L12 is connected in parallel with a series circuit constituted of the piezoelectric resonance element PR1 and the inductor L11. The variable capacitor VC12 is connected in parallel with the series circuit including the piezoelectric resonance element PR1, the inductor L11, and the variable capacitor VC11. In this structure, the inductors L11 and L12 increase the distance between a resonance point and an anti-resonance point of the piezoelectric resonance element PR1 on a frequency axis. Also, adjusting the capacitances of the variable capacitors VC11 and VC12 enables an adjustment of the positions of the resonance point and the anti-resonance point on the frequency axis. Therefore, the frequencies of a pass band and an attenuation band are adjusted.

The variable resonance circuit 92 includes a piezoelectric resonance element PR2, inductors L21 and L22, and variable capacitors VC21 and VC22. The piezoelectric resonance element PR2, the inductor L22, and the variable capacitor VC22 are connected in series. This series circuit is connected to a connection line between the second input and output terminal P2 and the variable resonance circuit 91 at an end portion on the side of the variable capacitor VC22, and connected to the ground at the other end portion on the side of the piezoelectric resonance element PR2. The piezoelectric resonance element PR2, the inductor L21, and the variable capacitor VC21 are connected in parallel with one another. In this structure, the inductors L21 and L22 increase the distance between a resonance point and an anti-resonance point of the piezoelectric resonance element PR2 on a frequency axis. Also, adjusting the capacitances of the variable capacitors VC21 and VC22 enables an adjustment of the positions of the resonance point and the anti-resonance point on the frequency axis. Therefore, the frequencies of a pass band and an attenuation band are adjusted.

In the filter circuit 90 having this circuit configuration, the above-described structure of the resonance circuit complex electronic component 10 is applicable to a portion including the piezoelectric resonance element PR1 and the variable capacitor VC12, or a portion including the piezoelectric resonance element PR2 and the variable capacitor VC21. Also, a combination of the above-described inductor element 20 and the meandering conductive pattern of the resonance circuit complex electronic component 10 is applicable to the inductor L11, L21, or L22.

Therefore, a compact filter circuit 90 is provided and has favorable variable filter characteristics, that is, a low insertion loss and a sharp attenuation from the pass band to the attenuation band.

Figure 6:
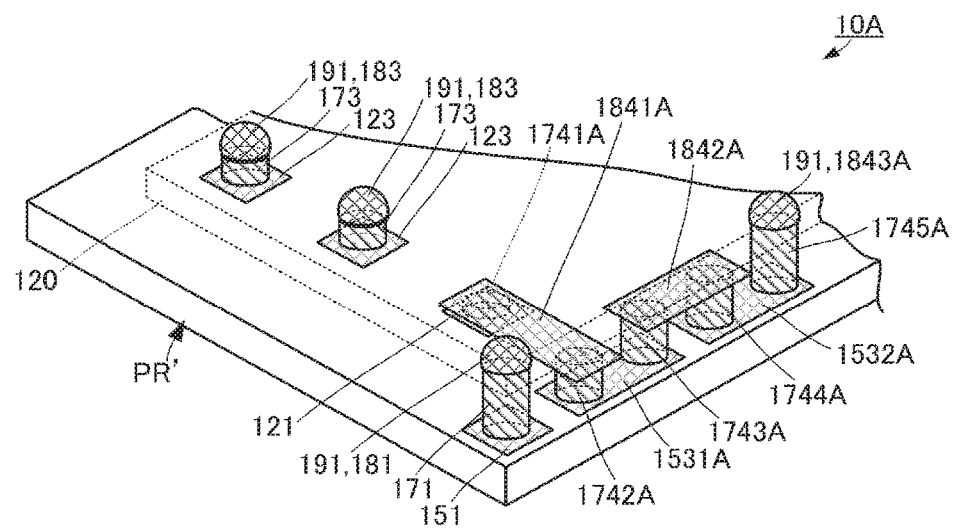
FIG. 6 is an enlarged perspective view of a portion of a resonance circuit complex electronic component according to a second preferred embodiment of the present invention.

Next, a resonance circuit complex electronic component according to a second preferred embodiment of the present invention will be described with reference to the drawings. FIG. 6 is an enlarged perspective view of a portion of the resonance circuit complex electronic component according to the second preferred embodiment of the present invention.

A resonance circuit complex electronic component 10A according to the second preferred embodiment and the resonance circuit complex electronic component 10 according to the first preferred embodiment have the same or similar basic structure, but are different in the structure of the meandering conductive pattern. Thus, only the difference will be described below.

Routing conductors 1531A and 1532A are provided in or on a mounting surface of a piezoelectric resonance element PR' in an area along the outer circumferential edge of the mounting surface of the piezoelectric resonance element PR' that does not contact a variable capacitor 120. The routing conductors 1531A and 1532A are preferably rectangular or substantially rectangular in a plan view, and are disposed while leaving a gap therebetween in a longitudinal direction. The routing conductors 1531A and 1532A are disposed such that their longitudinal direction is in parallel or substantially in parallel with a side surface of the variable capacitor 120 that is in close proximity to the routing conductors 1531A and 1532A.

In or on the surface of a terminal conductor 121 of the variable capacitor 120, a via conductor 1741A, which extends in a direction orthogonal or substantially orthogonal to the surface, is provided. On the surface of the routing conductor 1531A, via conductors 1742A and 1743A, which extend in a direction orthogonal or substantially orthogonal to the surface, are provided. The via conductor 1742A is located in the vicinity of one end of the routing conductor 1531A in the longitudinal direction, while the via conductor 1743A is located in the vicinity of the other end of the routing conductor 1531A in the longitudinal direction.

In or on the surface of the routing conductor 1532A, via conductors 1744A and 1745A, which extend in a direction orthogonal or substantially orthogonal to the surface, are provided. The via conductor 1744A is located in the vicinity of one end of the routing conductor 1532A in the longitudinal direction, while the via conductor 1745A is located in the vicinity of the other end of the routing conductor 1532A in the longitudinal direction.

The via conductors 1741A and 1742A are connected in or on the surface of an insulating resin (corresponding to the insulating resin 160 of the first preferred embodiment) through the routing conductor 1841A. The via conductors 1743A and 1744A are connected in or on the surface of the insulating resin (corresponding to the insulating resin 160 of the first preferred embodiment) through the routing conductor 1842A. An external connection terminal conductor 1843A is provided at a distal end of the via conductor 1745A, and a solder ball 191 is provided on the surface of the external connection terminal conductor 1843A.

In this structure, a meandering conductive pattern that includes the via conductor 1741A, the routing conductor 1841A, the via conductor 1742A, the routing conductor 1531A, the via conductor 1743A, the routing conductor 1842A, the via conductor 1744A, the routing conductor 1532A, and the via conductor 1745A connected in this order is provided. This meandering conductive pattern is used as a portion of an inductor, thus obtaining the same or similar effects as in the first preferred embodiment.

Furthermore, in the structure of the second preferred embodiment, the meandering conductive pattern extends as a whole in the direction parallel or substantially parallel with the side surface of the variable capacitor 120 in close proximity thereto. Thus, even if the distance between the side surface of the variable capacitor 120 and the side surface of the piezoelectric resonance element PR' is short in the area of the piezoelectric resonance element PR' that does not contact the variable capacitor 120, the meandering conductive pattern is able to be provided with a longer length. Thus, an inductor having a further improved Q value is provided.

Figure 7:
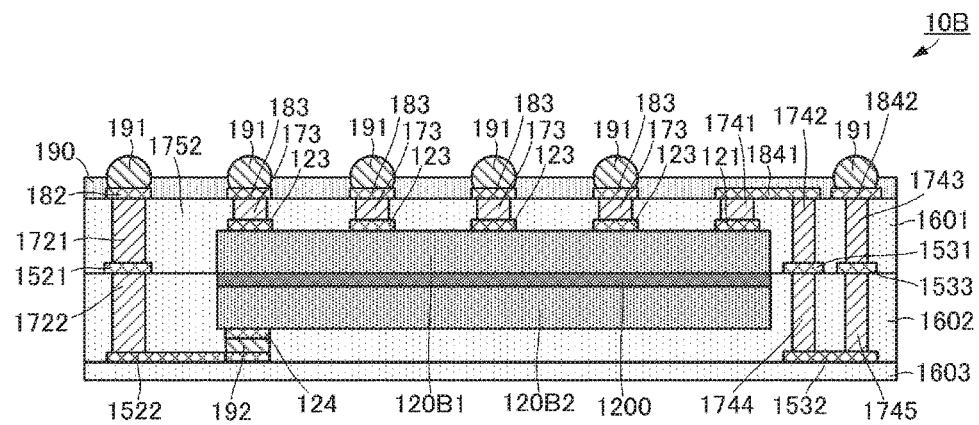
FIG. 7 is a side view of a resonance circuit complex electronic component according to a third preferred embodiment of the present invention.

Next, a resonance circuit complex electronic component according to a third preferred embodiment of the present invention will be described with reference to the drawings. FIG. 7 is a side view of the resonance circuit complex electronic component according to the third preferred embodiment of the present invention.

The difference between a resonance circuit complex electronic component 10B according to the third preferred embodiment and the resonance circuit complex electronic component 10 according to the first preferred embodiment is that two variable capacitors 120B1 and 120B2 are laminated within the multilayer member, and the piezoelectric resonance element PR is not provided in the multilayer member. The remaining structure is the same as or similar to the basic structure of the resonance circuit complex electronic component 10 according to the first preferred embodiment.

The variable capacitors 120B1 and 120B2 are in contact with each other on surfaces opposite to the mounting surfaces thereof. In this preferred embodiment, the variable capacitors 120B1 and 120B2 are preferably bonded with an adhesive layer 1200. This adhesive layer 1200 may be omitted. The variable capacitor 120B1 is disposed on the side of a mounting surface of the resonance circuit complex electronic component 10B, relative to the variable capacitor 120B2.

The multilayer member of the resonance circuit complex electronic component 10B preferably includes three layers of, for example, insulating resins 1601, 1602, and 1603. The insulating resin 1601 is provided in an area on the side of the variable capacitor 120B1, relative to a contact surface between the variable capacitors 120B1 and 120B2. The insulating resin 1602 is provided in an area on the side of the variable capacitor 120B2, relative to the contact surface between the variable capacitors 120B1 and 120B2. The insulating resin 1603 is disposed on a surface of the insulating resin 1602 on the opposite side to a surface contacting the insulating resin 1601.

A terminal conductor 121 of the variable capacitor 120B1 is connected to an external connection terminal conductor 1842 through a via conductor 1741 provided in the insulating resin 1601, a routing conductor 1841 provided in or on the surface of the insulating resin 1601, a via conductor 1742 provided in the insulating resin 1601, a connection conductor 1531 provided at an interface between the insulating resins 1601 and 1602, a via conductor 1744 provided in the insulating resin 1602, a routing conductor 1532 provided at an interface between the insulating resins 1602 and 1603, a via conductor 1745 provided in the insulating resin 1602, a connection conductor 1533 provided at the interface between the insulating resins 1601 and 1602, and a via conductor 1743 provided in the insulating resin 1601. That is, the terminal conductor 121 of the variable capacitor 120B1 is connected to the external connection terminal conductor 1842 through a meandering conductive pattern.

A terminal conductor 124 of the variable capacitor 120B2 is connected to a routing conductor 1522 provided at the interface between the insulating resins 1602 and 1603 by a conductor, such as solder 192 or other suitable connection, for example. The routing conductor 1522 is connected to an external connection terminal conductor 182 through a via conductor 1722 provided in the insulating resin 1602, a connection conductor 1521 provided at the interface between the insulating resins 1601 and 1602, and a via conductor 1721 provided in the insulating resin 1601.

As described above, the same or similar effects as in the first and second preferred embodiments are obtained even if an electronic component other than a piezoelectric resonance element is embedded in the multilayer member.

The insulating resins 1601 and 1602 preferably are individually provided in this preferred embodiment, but may be integrated instead. In this case, it may be possible to eliminate the need to provide the connection conductors 1521, 1531, and 1533, to integrate the via conductors 1721 and 1722, to integrate the via conductors 1742 and 1744, and to integrate the via conductors 1743 and 1745.

Figure 8:
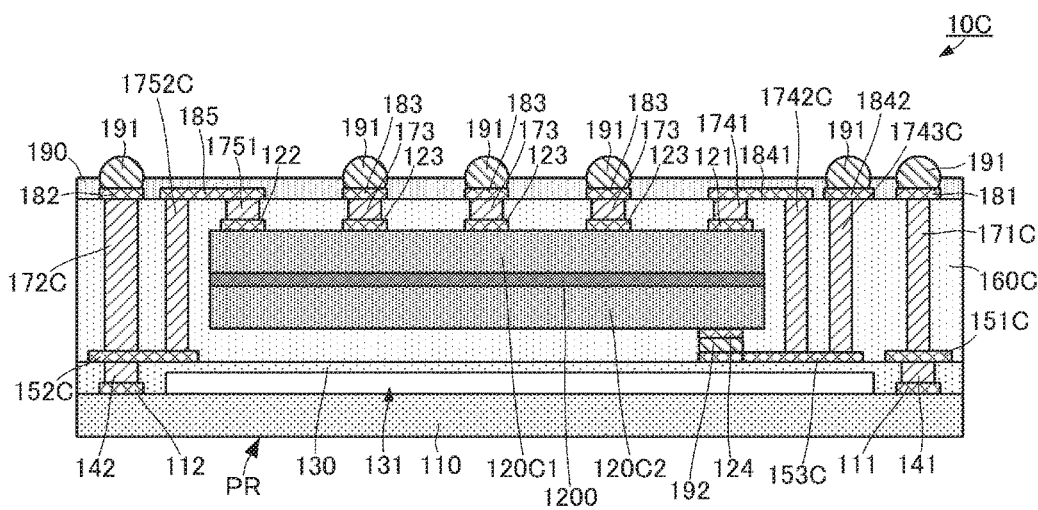
FIG. 8 is a side view of a resonance circuit complex electronic component according to a fourth preferred embodiment of the present invention.

Next, a resonance circuit complex electronic component according to a fourth preferred embodiment of the present invention will be described with reference to the drawings. FIG. 8 is a side view of the structure of the resonance circuit complex electronic component according to the fourth preferred embodiment of the present invention.

In a resonance circuit complex electronic component 100 according to the fourth preferred embodiment, variable capacitors 120C1 and 120C2 are laminated on a piezoelectric resonance element PR. The remaining basic structure of the resonance circuit complex electronic component 100 is the same as or similar to the remaining basic structure of the resonance circuit complex electronic components 10 and 10B according to the first and third preferred embodiments.

The variable capacitors 120C1 and 120C2 are laminated such that surfaces opposite to the mounting surfaces contact each other. A member defined by the laminated variable capacitors 120C1 and 120C2 is disposed on the side of a mounting surface of the piezoelectric resonance element PR.

A terminal conductor 124 of the variable capacitor 120C2 is connected to a routing conductor 153C provided in or on a surface that contacts the mounting surface of the piezoelectric resonance element (i.e., the piezoelectric resonance element PR and an insulating resin 160C) by a conductor, such as solder 192 or other suitable connection conductor, for example. This routing conductor 153C defines and functions as a portion of a meandering conductive pattern that connects a terminal conductor 121 of the variable capacitor 120C1 to an external connection terminal conductor 1842.

This structure provides the same or similar effects as in each of the preferred embodiments described above. In the structure of the fourth preferred embodiment, since the two variable capacitors 120C1 and 120C2 and the piezoelectric resonance element PR are overlapped in a plan view, a compact resonance circuit complex electronic component 100 having increased functions is provided.

Figure 9:
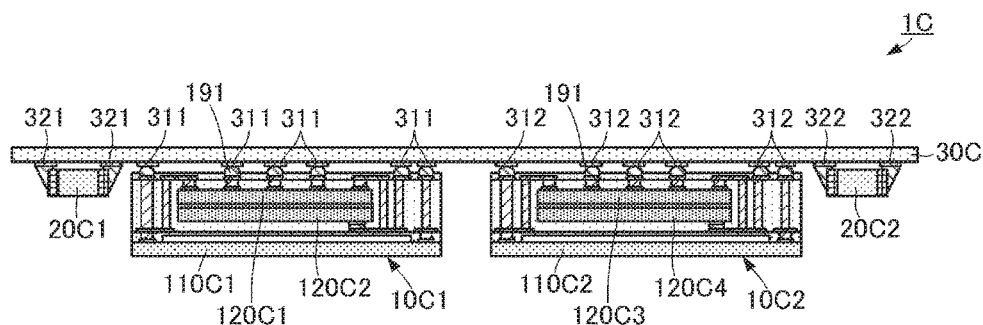
FIG. 9 is a side view of a resonance circuit device including a resonance circuit complex electronic component according to the fourth preferred embodiment of the present invention.

Using the resonance circuit complex electronic components 100 having this structure, the following resonance circuit device is able to be provided. FIG. 9 is a side view of the resonance circuit device according to the fourth preferred embodiment of the present invention.

As shown in FIG. 9, a resonance circuit device 10 includes resonance circuit complex electronic components 10C1 and 10C2, surface mount inductor elements 20C1 and 20C2, and a board 30C. The board 30C is, preferably a dielectric board in which mounting lands 311, 312, 321, and 322 are provided. The mounting lands 311 and 312 are land conductors on which the resonance circuit complex electronic components 10C1 and 10C2 are mounted, respectively. The mounting lands 321 and 322 are land conductors on which the surface mount inductor elements 20C1 and 20C2 are mounted, respectively.

A meandering conductive pattern of the resonance circuit complex electronic component 10C1 and the surface mount inductor element 20C1 are connected through a conductive pattern (conductive pattern) provided in the board 30 to connect the mounting lands 311 and 321. A meandering conductive pattern of the resonance circuit complex electronic component 10C2 and the surface mount inductor element 20C2 are connected through a conductive pattern provided in or on the board 30 to connect the mounting lands 312 and 322.

This structure produces a compact filter circuit including a plurality of piezoelectric resonance elements PR1 and PR2, as with the filter circuit 90 shown in FIG. 5. In addition, the meandering conductive patterns included in the resonance circuit complex electronic components 10C1 and 10C2 are used as inductors, thus achieving an improvement in the Q values of the inductors and an improvement in filter characteristics.

In each of the preferred embodiments described above, an example in which the routing via conductors preferably extend in a direction orthogonal or substantially orthogonal to the mounting surface is shown. However, the via conductors may extend in any direction unless the direction is at an angle of 0° with the mounting surface. However, with the structure in which the routing via conductors extend in the direction orthogonal or substantially orthogonal to the mounting surface, the routing via conductors are able to be easily provided and configured.

Figure 10:
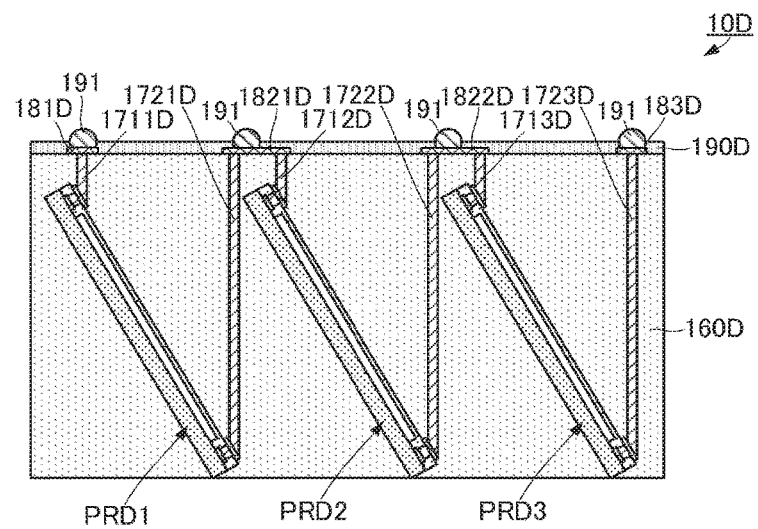
FIG. 10 is a side view of a resonance circuit complex electronic component according to a fifth preferred embodiment of the present invention.

Next, a resonance circuit complex electronic component according to a fifth preferred embodiment of the present invention will be described with reference to the drawings. FIG. 10 is a side view of the resonance circuit complex electronic component according to the fifth preferred embodiment of the present invention.

In a resonance circuit complex electronic component 10D according to the fifth preferred embodiment, a plurality of piezoelectric resonance elements PRD1, PRD2, and PRD3 are embedded in an insulating resin 160D, that is, a multilayer member. At this time, the plurality of piezoelectric resonance elements PRD1, PRD2, and PRD3 are fixed such that mounting surfaces of the piezoelectric resonance elements PRD1, PRD2, and PRD3 are arranged at a predetermined angle other than 0° with respect to a mounting surface of the resonance circuit complex electronic component 10D.

In a surface of an insulating resin 160D (a surface of the resonance circuit complex electronic component 10D on the side of the mounting surface), external connection terminal conductors 181D, 1821D, 1822D, and 183D are provided.

One of terminal conductors of the piezoelectric resonance element PRD1 is connected to the external connection terminal conductor 181D through a via conductor 1711D extending in a thickness direction (direction orthogonal or substantially orthogonal to the mounting surface of the resonance circuit complex electronic component 10D) of the insulating resin 160D. The other terminal conductor of the piezoelectric resonance element PRD1 and one of terminal conductors of the piezoelectric resonance element PRD2 are connected to the external connection terminal conductor 1821D through via conductors 1721D and 1712D extending in the thickness direction (direction orthogonal or substantially orthogonal to the mounting surface of the resonance circuit complex electronic component 10D) of the insulating resin 160D, respectively. The other terminal conductor of the piezoelectric resonance element PRD2 and one of terminal conductors of the piezoelectric resonance element PRD3 are connected to the external connection terminal conductor 1822D through via conductors 1722D and 1713D extending in the thickness direction (direction orthogonal or substantially orthogonal to the mounting surface of the resonance circuit complex electronic component 10D) of the insulating resin 160D, respectively. The other terminal conductor of the piezoelectric resonance element PRD3 is connected to the external connection terminal conductor 183D through via conductor 1723D extending in the thickness direction (direction orthogonal or substantially orthogonal to the mounting surface of the resonance circuit complex electronic component 10D) of the insulating resin 160D.

With this structure, it is possible to increase the length of the via conductors that connect the other terminal conductors of the piezoelectric resonance elements PRD1, PRD2, and PRD3 to the external connection terminal conductors, thus facilitating the via conductors being used as an inductor.

In this configuration of the fifth preferred embodiment, since the mounting surfaces of the piezoelectric resonance elements PRD1, PRD2, and PRD3 are not in parallel or substantially in parallel with the mounting surface of the resonance circuit complex electronic component 10D, the piezoelectric resonance elements PRD1, PRD2, and PRD3 is able to be located in a small area. Thus, the resonance circuit complex electronic component 10D is able to be made compact.

Figure 11:
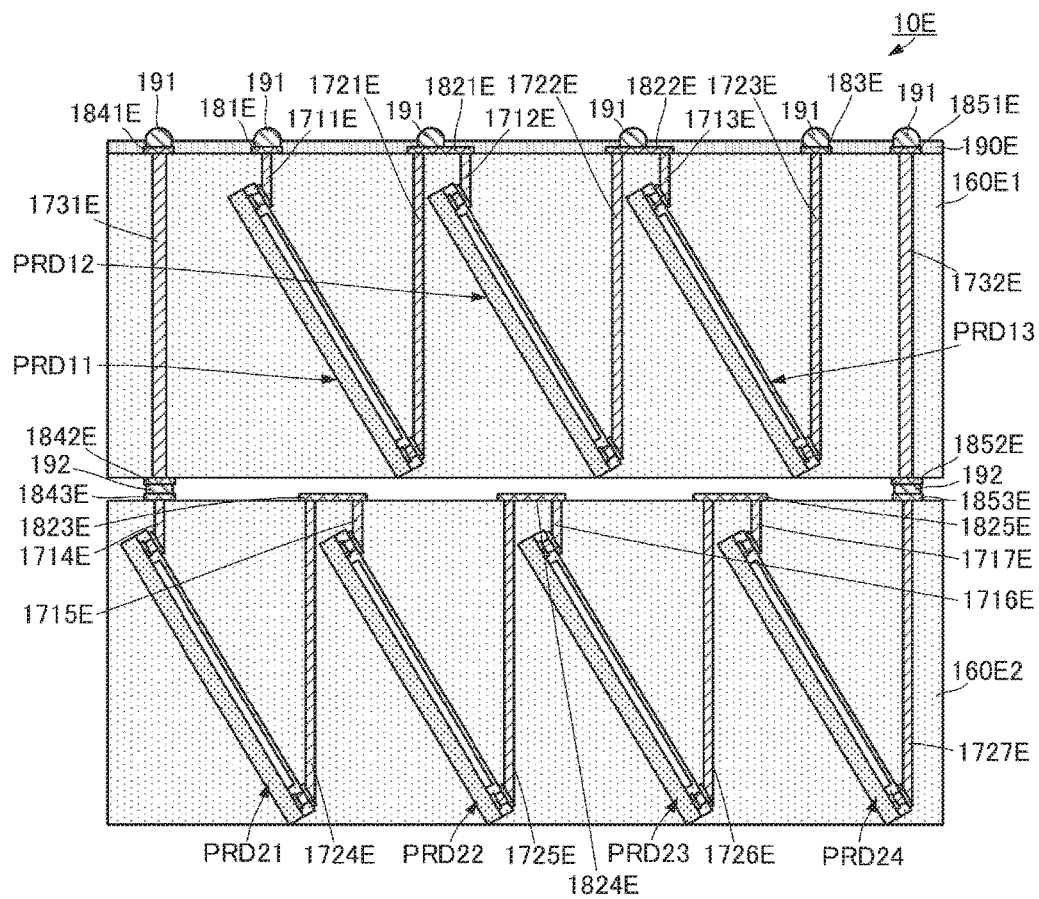
FIG. 11 is a side view of a resonance circuit complex electronic component according to a sixth preferred embodiment of the present invention.

Next, a resonance circuit complex electronic component according to a sixth preferred embodiment of the present invention will be described with reference to the drawings. FIG. 11 is a side view of the structure of the resonance circuit complex electronic component according to the sixth preferred embodiment of the present invention.

In a resonance circuit complex electronic component 10E according to the sixth preferred embodiment, the same or similar structures as the resonance circuit complex electronic component 10D according to the fifth preferred embodiment are laminated in two layers. Multilayer members laminated in layers each have the same or similar structure as the resonance circuit complex electronic component 10D according to the fifth preferred embodiment.

In the multilayer member on the side of a mounting surface of a resonance circuit complex electronic component 10E, piezoelectric resonance elements PRD11, PRD12, and PRD13 are embedded. In another multilayer member on the side of a mounting surface of the multilayer member in which the piezoelectric resonance elements PRD11, PRD12, and PRD13 are embedded, piezoelectric resonance elements PRD21, PRD22, PRD23, and PRD24 are embedded.

One of terminal conductors of the piezoelectric resonance element PRD21 is connected to a terminal conductor 1843E through a via conductor 1714E extending in a thickness direction (direction orthogonal or substantially orthogonal to the mounting surface of the resonance circuit complex electronic component 10E) of an insulating resin 160E2. The other terminal conductor of the piezoelectric resonance element PRD21 and one of terminal conductors of the piezoelectric resonance element PRD22 are connected to a routing conductor 1823E through via conductors 1724E and 1715E extending in the thickness direction of the insulating resin 160E2, respectively. The other terminal conductor of the piezoelectric resonance element PRD22 and one of terminal conductors of the piezoelectric resonance element PRD23 are connected to a routing conductor 1824E through via conductors 1725E and 1716E extending in the thickness direction of the insulating resin 160E2, respectively. The other terminal conductor of the piezoelectric resonance element PRD23 and one of terminal conductors of the piezoelectric resonance element PRD24 are connected to a routing conductor 1825E through via conductors 1726E and 1717E extending in the thickness direction of the insulating resin 160E2, respectively. The other terminal conductor of the piezoelectric resonance element PRD24 is connected to a terminal conductor 1853E through a via conductor 1727E extending in the thickness direction of the insulating resin 160E2.

The terminal conductor 1843E is connected to a terminal conductor 1842E of the multilayer member in which the piezoelectric resonance elements PRD11, PRD12, and PRD13 are embedded, on the opposite surface to the mounting surface, through a solder 192 and other suitable connection conductor, for example. The terminal conductor 1842E is connected to an external connection terminal conductor 1841E through a via conductor 1731E extending in a thickness direction (direction orthogonal or substantially orthogonal to the mounting surface of the resonance circuit complex electronic component 10E) of an insulating resin 160E1.

The terminal conductor 1853E is connected to a terminal conductor 1852E of the multilayer member in which the piezoelectric resonance elements PRD11, PRD12, and PRD13 are embedded, on the opposite surface to the mounting surface, through a solder 192 and other suitable connection conductor, for example. The terminal conductor 1852E is connected to an external connection terminal conductor 1851E through a via conductor 1732E extending in the thickness direction (direction orthogonal or substantially orthogonal to the mounting surface of the resonance circuit complex electronic component 10E) of the insulating resin 160E1.

This structure enables denser integration of the piezoelectric resonance elements.

In each of the preferred embodiments described above, the piezoelectric resonance element preferably is a surface acoustic wave resonance element, for example. However, a boundary acoustic wave resonance element, a bulk acoustic wave resonance element, or a plate wave resonance element may be used instead.

Figure 12:
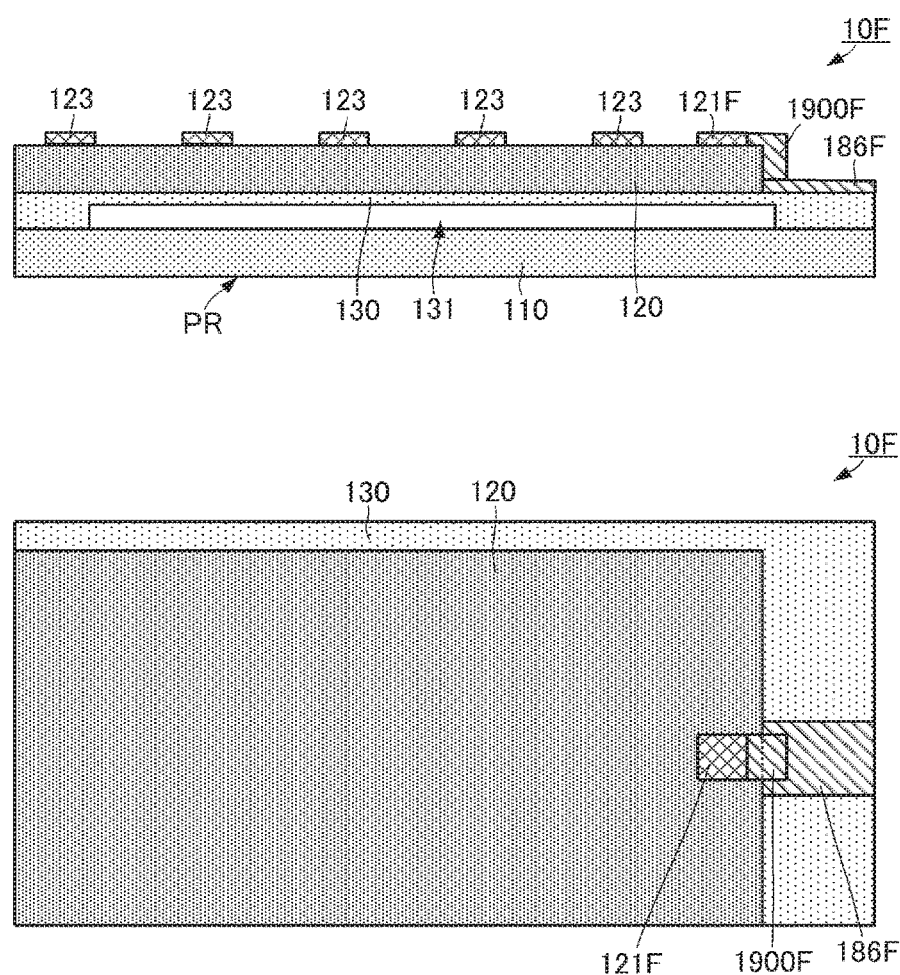
FIG. 12 includes a side view and a plan view of a resonance circuit complex electronic component according to another preferred embodiment of the present invention.

Also, as in each of the above preferred embodiments, a structure shown in FIG. 12 enables a compact resonance circuit device having preferable characteristics to be provided. FIG. 12 is a side view and a plan view of the structure of the resonance circuit complex electronic component according to a preferred embodiment of the present invention. FIG. 12 illustrates only features of a preferred embodiment of the present invention, and abbreviates or omits the other portions. In FIG. 12, components indicated with reference signs have the same or similar function as the components indicated with the same reference signs in the above preferred embodiments. Thus, only the features will be described in a resonance circuit complex electronic component 10F shown in FIG. 12.

As shown in FIG. 12, in the resonance circuit complex electronic component 10F, a terminal conductor 121F of a variable capacitor 120 is connected to an external connection terminal conductor 186F provided on a piezoelectric resonance element PR through an inductor conductor 1900F. The inductor conductor 1900F includes a portion extending in a direction orthogonal or substantially orthogonal to a mounting surface, and this portion is disposed on a side surface of the variable capacitor 120 by sputtering and plating, for example. Thickening this portion reduces a resistance, just as with the via conductor described above. Although not shown in the drawing, a terminal conductor of a piezoelectric resonator 110 is connected to the external connection terminal conductor 186F.

As described above, the inductor conductor provided in the complex electronic component may have a structure that is exposed to the outside as shown in the resonance circuit complex electronic component 10F, instead of a structure covered with an insulating resin as described in each of the first to sixth preferred embodiments.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resonance circuit electronic component comprising:
   a first circuit element and a second circuit element defining a resonance circuit;
   a plurality of external connection terminals; and
   a plurality of routing conductors connecting external terminals of the first circuit element and external terminals of the second circuit element to the plurality of external connection terminals, respectively; wherein
   at least one of the plurality of routing conductors includes an inductor conductor extending in a direction not in parallel with a mounting surface;
   at least a portion of the inductor conductor overlaps the second circuit element in a thickness direction of the resonance circuit electronic component; and
   the inductor conductor is routed in the thickness direction a plurality of times.

2. The resonance circuit electronic component according to claim 1, wherein at least one of the first circuit element and the second circuit element is a variable capacitance element.

3. The resonance circuit electronic component according to claim 1, further comprising:
   a multilayer member including the first circuit element and the second circuit element embedded therein in a laminated state such that a mounting surface of the first circuit element and a mounting surface of the second circuit element are in parallel or approximately in parallel with each other, and one of the plurality of external connection terminals is provided in or on an outer surface on a side of the second circuit element along a lamination direction; wherein
   at least one of the plurality of routing conductors includes a portion of the inductor conductor that has a length greater than at least a thickness of the second circuit element.

4. The resonance circuit electronic component according to claim 3, wherein the inductor conductor extends in the lamination direction.

5. The resonance circuit electronic component according to claim 3, wherein
   the first circuit element has a larger area in a plan view than an area of the second circuit element; and
   when the multilayer member is viewed from the surface on which the plurality of external connection terminals are provided, a portion of the first circuit element overlaps the second circuit element, and the inductor conductor is provided in an area in which the first circuit element and the second circuit element do not overlap.

6. The resonance circuit electronic component according to claim 1, wherein the inductor conductor shifts a resonant frequency of the resonance circuit electronic component.

7. The resonance circuit electronic component according to claim 1, wherein the resonance circuit includes a variable filter.

8. The resonance circuit electronic component according to claim 1, wherein at least one of the first circuit element and the second circuit element is a resonator.

9. A resonance circuit device comprising:
   the resonance circuit electronic component according to claim 1;
   a surface mount inductor element; and
   a board on which the resonance circuit electronic component and the surface mount inductor element are mounted; wherein
   the surface mount inductor element and the inductor conductor are connected to each other.

10. The resonance circuit device according to claim 9, wherein at least one of the first circuit element and the second circuit element is a variable capacitance element.

11. The resonance circuit device according to claim 9, wherein the inductor conductor shifts a resonant frequency of the resonance circuit electronic component.

12. The resonance circuit device according to claim 9, wherein the resonance circuit includes a variable filter.

13. The resonance circuit device according to claim 9, wherein at least one of the first circuit element and the second circuit element is a resonator.

14. The resonance circuit device according to claim 9, wherein
   the board includes mounting lands provided therein; and
   the resonance circuit electronic component and the surface mount inductor element are connected to the board via the mounting lands.

15. The resonance circuit device according to claim 14, wherein
   the board includes a conductive pattern therein; and
   the resonance circuit electronic component and the surface mount inductor element are connected through the conductive pattern.

16. The resonance circuit device according to claim 14, wherein the resonance circuit electronic component is bonded to the mounting lands via solder balls.

\* \* \* \* \*